US006970807B2

(12) United States Patent
Kito et al.

(10) Patent No.: US 6,970,807 B2
(45) Date of Patent: Nov. 29, 2005

(54) DIAGNOSTIC SYSTEM AND METHOD FOR ELECTRIC LEAK DETECTING DEVICE

(75) Inventors: Yuji Kito, Nagoya (JP); Hiroshi Fujita, Kuwana (JP); Kazuyuki Kato, Kariya (JP); Toshiharu Asai, Toyota (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 11 days.

(21) Appl. No.: 10/855,508

(22) Filed: May 28, 2004

(65) Prior Publication Data

US 2004/0243288 A1 Dec. 2, 2004

(30) Foreign Application Priority Data

May 29, 2003 (JP) .............................. 2003-153219

(51) Int. Cl.⁷ .......................... G06F 19/00; B60L 1/00; H02H 7/00
(52) U.S. Cl. ..................... 702/183; 324/503; 361/42; 361/88; 361/93.1; 307/10.1; 307/10.7
(58) Field of Search .............................. 702/64, 65, 60, 702/63, 182, 183; 701/29, 31, 36, 99; 361/1, 361/42, 88, 93.1; 307/9–10.1, 10.6, 10.7; 724/500, 503, 509, 510, 511, 522, 523, 527, 724/538, 600, 76.11

(56) References Cited

U.S. PATENT DOCUMENTS

| | | | | |
|---|---|---|---|---|
| 5,818,236 | A * | 10/1998 | Sone et al. ................. | 324/509 |
| 5,995,885 | A * | 11/1999 | Pfeufer et al. ................ | 701/29 |
| 6,049,139 | A * | 4/2000 | Nagaura et al. ............ | 307/10.1 |
| 6,201,479 | B1 * | 3/2001 | Zydek et al. ................ | 340/664 |
| 6,349,022 | B1 * | 2/2002 | Myong et al. ............. | 361/93.1 |
| 6,388,451 | B1 * | 5/2002 | Burba et al. ................. | 324/522 |
| 6,498,494 | B2 * | 12/2002 | Belau et al. ................. | 324/522 |
| 6,525,918 | B1 * | 2/2003 | Alles et al. ................. | 361/93.1 |
| 6,577,138 | B2 * | 6/2003 | Zuercher et al. ............ | 324/536 |
| 6,678,132 | B1 * | 1/2004 | Carruthers et al. ........... | 361/42 |
| 2004/0004483 | A1 * | 1/2004 | Hazelton ..................... | 324/522 |
| 2004/0130326 | A1 * | 7/2004 | Yamamoto .................. | 324/503 |
| 2004/0212371 | A1 * | 10/2004 | Nomoto et al. ............. | 324/522 |
| 2004/0227521 | A1 * | 11/2004 | Higashihama et al. ...... | 324/522 |
| 2005/0036250 | A1 * | 2/2005 | Asano .......................... | 361/42 |

FOREIGN PATENT DOCUMENTS

| | | |
|---|---|---|
| JP | A 8-70503 | 3/1996 |
| JP | A 8-226950 | 9/1996 |
| JP | A 10-221395 | 8/1998 |

* cited by examiner

Primary Examiner—Patrick J. Assouad
(74) Attorney, Agent, or Firm—Kenyon & Kenyon

(57) ABSTRACT

A power supply unit includes a battery, a motor which is driven by the battery, an electric power converting device which is provided between the battery and the motor, a simulated electric leak generating device which generates an electric leak state between the battery and a vehicle body, and an electric leak detecting device which detects a simulated electric leak. A diagnostic system which performs a diagnosis of operating performance of the electric leak detecting device includes an opening/closing device which connects/disconnects the electric power converting device to/from the battery, and an opening/closing detecting device which detects opening/closing of the opening/closing device and which outputs a result of detection to the simulated electric leak generating device and the electric leak detecting device. When opening/closing of the opening/closing device is detected by the opening/closing detecting device, both generation of a simulated electric leak and detection of an electric leak are retried.

7 Claims, 4 Drawing Sheets

DIAGNOSTIC SYSTEM AND METHOD FOR ELECTRIC LEAK DETECTING DEVICE

INCORPORATION BY REFERENCE

The disclosure of Japanese Patent Application No. 2003-153219 filed on May 29, 2003 including the specification, drawings and abstract is incorporated herein by reference in its entirety.

BACKGROUND OF THE INVENTION

1. Field of the Invention

The invention relates to a diagnostic system and method for an electric leak detecting device in a power supply unit having an electric leak detecting function.

2. Description of the Related Art

There are cases where an electric current from a direct current power supply (battery) leaks to a vehicle body (a ground fault occurs) due to causes such as a contact failure of a bus line. Therefore, an electric leak is detected by an electric leak detecting device. When an electric leak is detected, an alarm lamp of a meter lights up, or the like.

According to Japanese Patent Laid-Open Publication No. 8-70503, in order to detect an electric leak, a rectangular wave is input in between a battery and a motor via a resistance and a coupling capacitor which are connected in series. Based on the fact that a voltage between the resistance and the coupling capacitor fluctuates according to an electric leak state, the voltage is monitored such that an electric leak is detected by an electric leak detecting device.

According to Japanese Patent Laid-Open Publication No. 8-226950, a switch is turned ON via a capacitor and a resistance, which are connected in series, such that a battery is grounded for a predetermined time and the capacitor is charged. A voltage of the capacitor is monitored such that an electric leak is detected by an electric leak detecting device.

Each of the electric leak detecting device disclosed in Japanese Patent Laid-Open Publication No. 8-70503 and the electric leak detecting device disclosed in Japanese Patent Laid-Open Publication No. 8-226950 includes a capacitor, and determines whether an electric leak has occurred while maintaining an insulation state between the battery and the motor. Unlike these electric leak detecting devices, an electric leak detecting device disclosed in Japanese Patent Laid-Open Publication No. 10-221395 forcibly (artificially) grounds a battery terminal via a resistance and a switch, and performs a diagnosis of an operating state of the electric leak detecting device which detects a simulated electric leak (ground fault) state so as to perform a self-diagnosis of the operating performance thereof.

However, with the electric leak detecting devices disclosed in Japanese Patent Laid-Open Publication No. 8-70503 and Japanese Patent Laid-Open Publication No.8-226950, it is difficult to detect an electric leak when an electric potential (common mode voltage) of the battery terminal with respect to an electric potential of a vehicle body fluctuates. This is because a transitional charging/discharging current corresponding to the fluctuation of the electric potential is supplied to the capacitor, and therefore a signal for detecting an electric leak fluctuates. This phenomenon, which occurs in the electric leak detecting devices disclosed in Japanese Patent Laid-Open Publication No. 8-70503 and Japanese Patent Laid-Open Publication No. 8-226950, also occurs in the electric leak detecting device disclosed in Japanese Patent Laid-Open Publication No. 10-221395. Since a signal for detecting a simulated electric leak fluctuates, it is difficult to perform an accurate self-diagnosis.

Among the configurations disclosed in the above-mentioned publications, there is a configuration where the switch and a relay are provided between the battery and an inverter. Even in this case, a diagnosis of the operating performance of an electric leak detecting circuit is performed regardless of an ON/OFF state the relay and the like. Therefore, it is difficult to accurately perform a diagnosis of the operating performance of the electric leak detecting circuit disclosed in the publication.

SUMMARY OF THE INVENTION

It is an object of the invention to provide a diagnostic system which performs a diagnosis on whether an electric leak detecting device, that detects an electric leak (a real electric leak and a simulated electric leak), operates reliably even when a common mode voltage fluctuates, in a power supply unit for a vehicle.

The inventor paid attention to a relationship between a common mode voltage, and an impedance between a high voltage side of a power supply unit and a vehicle body (vehicle impedance). The vehicle impedance varies depending on whether a relay, which may be provided between a battery and an inverter for safety, is ON or OFF. When the relay in ON, since an electric circuit is constituted of the battery, the inverter and a motor, the vehicle impedance is smaller than that when the relay is OFF. As a result, the common mode voltage is low when the relay is ON, and is high when the relay is OFF.

According to a first aspect of the invention, there is provided a diagnostic system which performs a diagnosis of operating performance of an electric leak detecting device, in a power supply unit including a battery, a motor which is driven by the battery, an electric power converting device which is provided between the battery and the motor, a simulated electric leak generating device which generates a simulated state, where an electric leak has occurred, (hereinafter, referred to as a "simulated electric leak state") between the battery and a vehicle body, and the electric leak detecting device which detects a simulated electric leak. The diagnostic system includes an opening/closing device which connects/disconnects the electric power converting device to/from the battery, and an opening/closing detecting device which detects opening/closing of the opening/closing device and which outputs the result of detection to the simulated electric leak generating device and the electric leak detecting device. The electric leak detecting device performs at least one of retry and temporary suspension of both generation of a simulated electric leak and detection of an electric leak, when opening/closing of the opening/closing device is detected by the opening/closing detecting device.

In the diagnostic system, when the opening/closing detecting device detects opening/closing of the opening/closing device, if a diagnosis of the operating performance of the electric leak detecting device is not performed, at least one of retry and temporary suspension of both generation of a simulated electric leak by the simulated electric leak generating device and detection of an electric leak by the electric leak detecting device is performed.

The opening/closing device according to the first aspect may connect the electric power converting device to the battery when an ignition key is at a start position, and may disconnect the electric power converting device from the battery when the ignition key is at positions other than the start position.

The opening/closing detecting device according to the first aspect may notify the simulated electric leak generating device of opening/closing of the opening/closing device via the electric leak detecting device.

According to a second aspect of the invention, there is provided a diagnostic system which performs a diagnosis of operating performance of an electric leak detecting device, in a power supply unit including a battery, a motor which is driven by the battery, an electric power converting device which is provided between the battery and the motor, and the electric leak detecting device which detects an electric leak between the battery and a vehicle body. The diagnostic system includes an opening/closing device which connects/disconnects the electric power converting device to/from the battery, and an opening/closing detecting device which detects opening/closing of the opening/closing device and which outputs the result of detection to the electric leak detecting device. The electric leak detecting device performs at least one of retry and temporary suspension of detection of an electric leak, when opening/closing of the opening/closing device is detected by the opening/closing detecting device.

In the diagnostic system, when the opening/closing detecting device detects opening/closing of the opening/closing device, if a diagnosis of the operating performance of the electric leak detecting device is not performed, at least one of retry and temporary suspension of detection of an electric leak by the electric leak detecting device is performed.

The opening/closing device according to the second aspect may connect the electric power converting device to the battery when an ignition key is at a start position, and may disconnect the electric power converting device from the battery when the ignition key is at positions other than the start position.

According to a third aspect of the invention, there is provided a diagnostic method for performing a diagnosis of operating performance of an electric leak detecting device. The diagnostic method includes the steps of: generating an electric leak state between a battery and a vehicle body; connecting/disconnecting an electric power converting device, which is provided between the battery and a motor, to/from the battery; detecting connection/disconnection between the battery and the electric power converting device; and performing at least one of retry and temporary suspension of both generation of a simulated electric leak and detection of an electric leak, when connection/disconnection between the battery and the electric power converting device is detected.

According to a fourth aspect of the invention, there is provided a diagnostic method for performing a diagnosis of operating performance of an electric leak detecting device. The diagnostic method includes the steps of: detecting an electric leak between a battery and a vehicle body; connecting/disconnecting an electric power converting device, which is provided between the battery and a motor, to/from the battery; detecting connection/disconnection between the battery and the electric power converting device; and performing at least one of retry and temporary suspension of detection of an electric leak, when connection/disconnection between the battery and the electric power converting device is detected.

In the first aspect, the electric leak detecting device detects an electric state generated by the simulated electric leak generating device, and the diagnostic system performs a diagnosis of an operation state of the electric leak detecting device in the electric state generated by the simulated electric leak generating device.

The electric leak detecting device may be constituted of a part of a power supply ECU, and may detect and monitor a charge state of the battery by detecting an electric current. Accordingly, the electric leak detecting device may includes a transmission circuit, a comparator, a transistor for lamp control, an electric leak detecting circuit abnormality counter, and the like.

A value shown by the electric leak detecting circuit abnormality counter increases when an electric leak is not detected in the simulated electric leak state. When the value reaches a predetermined count value within a predetermined time, it is determined that there is an abnormality in the detection by the electric leak detecting device. There are many cases where the entire electric leak detecting device is made as an IC. An example of a typical abnormality is a failure of the transistor which controls lighting of an LED.

The opening/closing device of the diagnostic system may be constituted of a relay, and the opening/closing detecting device may be constituted of a hybrid ECU. The hybrid ECU controls an entire vehicle system. In the relationship with the power supply unit, the hybrid ECU may controls the amount of electric power charged to the battery using the relationship with the vehicle state. When the opening/closing device is opened/closed, the diagnostic system may retry a diagnosis of the operating performance of the electric leak detecting device, that is, a failure determination. Also, the diagnostic system may stop the diagnosis for a predetermined time until a common mode voltage become stable. Also, the diagnostic system may retry the diagnosis after a predetermined time of suspension.

In the second aspect, the diagnostic system performs a diagnosis of the operation state of the electric leak detecting device which detects a real (normal) electric leak. The electric leak detecting device may include a transmission circuit, a comparator, a transistor for lamp control, an electric leak counter, and the like. A value shown by the electric leak counter may increase when an electric leak is detected, and the value may be reset to zero when an electric leak is not detected. When the value shown by the electric leak counter reaches a predetermined value, it may be determined that an electric leak has occurred.

For the diagnostic system, basically, the same configuration as that in the first aspect may be employed. Namely, the opening/closing device may be constituted of a relay, and the opening/closing detecting device may be constituted of an ECU. When the opening/closing device is opened/closed, the diagnostic system may retry a diagnosis of the operating performance of the electric leak detecting device, that is, a failure determination. Also, the diagnostic system may stop the diagnosis for a predetermined time until a common mode voltage becomes stable. Also, the diagnostic system may retry the diagnosis after a predetermined time of suspension.

BRIEF DESCRIPTION OF THE DRAWINGS

The foregoing and further objects, features and advantages of the invention will become apparent from the following description of preferred embodiments with reference to the accompanying drawings, wherein like numerals are used to represent like elements and wherein.

DETAILED DESCRIPTION OF THE PREFERRED EMBODIMENTS

Hereafter, exemplary embodiments of the invention will be described with reference to accompanying drawings.

Figure 1:
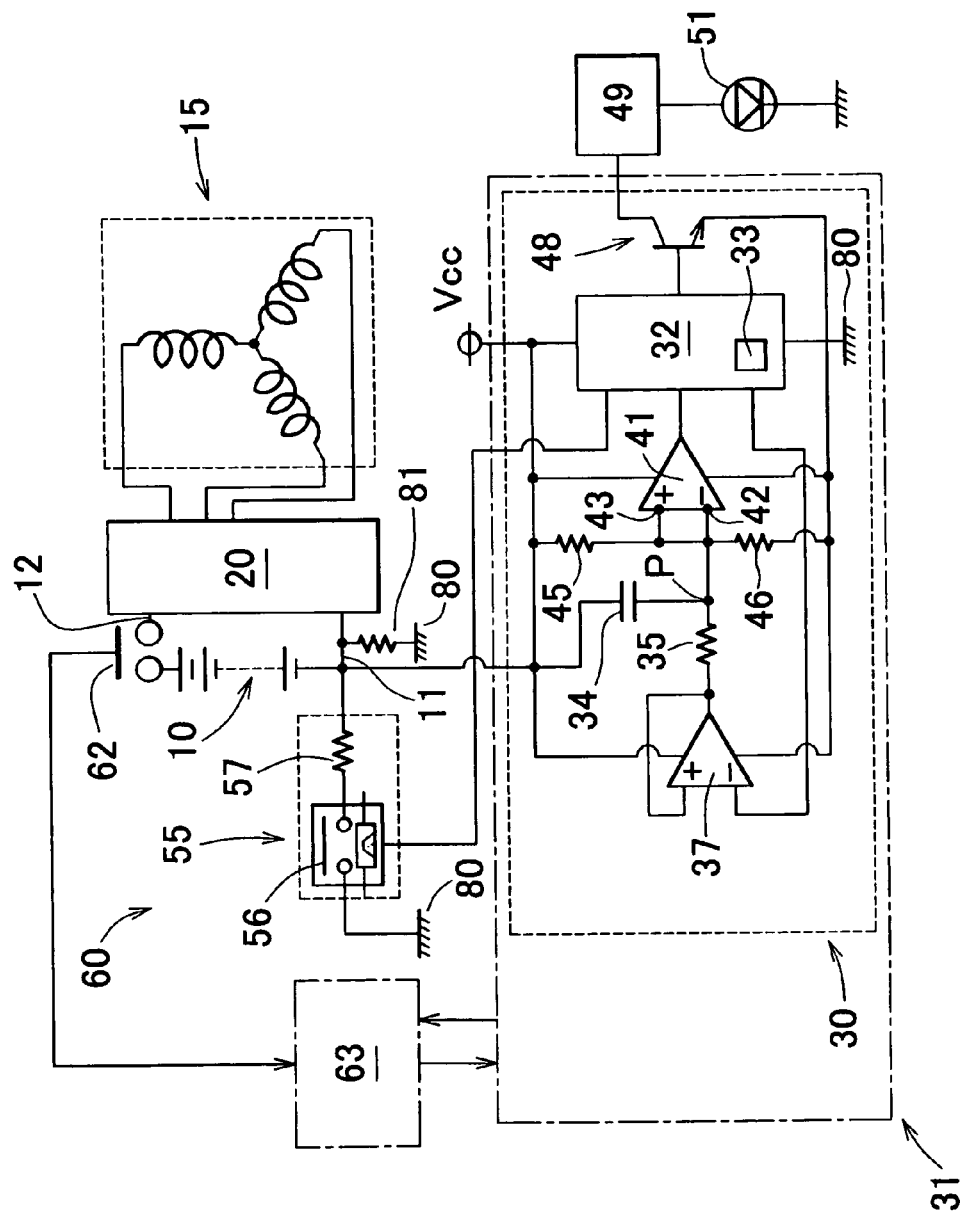
FIG. 1 is a schematic diagram of a circuit, which shows a first embodiment of the invention.

A first embodiment of the invention will be described. As shown in FIG. 1, a power supply unit of a hybrid vehicle includes a battery (direct current power supply) 10, a three-phase alternating current motor (hereinafter, simply referred to as a "motor") 15 which is driven by the battery 10, and an electric power converting device (hereinafter, referred to as an "inverter") 20 which is provided between the battery 10 and the motor 15 and which converts electric power form a direct current to an alternating current. The power supply unit further includes an electric leak detecting circuit 30 and a simulated electric leak generating device 55. The electric leak detecting device (detecting circuit) 30 constitutes a part of a battery ECU 31, and includes a transmission circuit 32, a buffer 37, a comparator 41, a transistor 48 and the like. The transmission circuit 32 includes a transmission portion 33 and a plurality of terminals. After a predetermined time has elapsed since an ignition key is turned to an IG position, a rectangular wave transmitted from the transmission portion 33 is input in the buffer 37, and is buffered. The battery 10 and the electric leak detecting device 30 are insulated from each other by a capacitor 34.

A reference voltage is input in a non-reversible input terminal 43 of the comparator 41. The reference voltage is obtained by dividing a voltage Vcc by a resistance 45 and a resistance 46, and has a constant level. The resistance values for the resistance 45 and the resistance 46 are selected such that the level of the voltage is lower than that of the rectangular wave which is input from the buffer 37 to a reversible input terminal 42 when an electric leak has not occurred, and is higher than that of the rectangular wave which is input when a simulated electric leak is generated. Namely, the level of the rectangular wave which is input in the reversible input terminal 42 is lower than the reference voltage, when a simulated electric leak is generated.

The transmission circuit 32 turns ON/OFF the transistor 48 according to an input from the comparator 41. A driving portion 49 turns an LED 51 ON/OFF according to an ON/OFF state of the transistor 48. More particularly, the comparator 41 outputs a pulse when an electric leak has not occurred (during normal time), and outputs a signal indicative of "high" when an electric leak has occurred. The transmission circuit 32 turns the transistor 48 ON and OFF when the pulse is input from the comparator 41, turns the transistor 48 ON when the signal indicative of "high" is input, and turns the transistor 48 OFF when a signal indicative of "low" is input.

When the electric leak detecting device 30 is operating normally, the transistor 48 is turned ON/OFF, and the LED 51 is OFF. When an abnormality occurs, for example, when the transistor 48 is short or open, the LED 51 is ON.

The simulated electric leak generating device (ground fault trying circuit) 55, which is provided between a vehicle body 80 and the inverter 20, includes a relay 56 on the vehicle body 80 side and a resistance 57 on the inverter 20 side. The relay 56 is turned ON according to a signal from the transition circuit 32, and grounds the battery 10 to the vehicle body 80 so as to artificially generate an electric leak state.

A diagnostic system 60 includes a second relay 62 and a hybrid ECU 63. The second relay 62 is provided in a bus line 12. The second relay 62 is ON when the ignition key is at the start position, and is OFF when the ignition key is at positions other than the start position. A signal indicative of an ON/OFF state of the second relay 62 is input in the hybrid ECU 63. The hybrid ECU 63 communicates with the battery ECU 31.

During normal time (when an electric leak has not occurred), the first relay 56 is open. When the first relay 56 is closed according to a signal from the transmission circuit 32, an electric current from the battery 10 is supplied to the vehicle body 80, and the voltage applied to a point P, that is, the level of the reversible input terminal 42 of the comparator 41 becomes lower. On the other hand, the level of the reference voltage, which is input in the non-reversible input terminal 43, is constant. Accordingly, the comparator 41 outputs a pulse, the transistor 48 is turned ON/OFF according to the pulse, and the LED 51 is OFF.

When a simulated electric leak is generated, if the first relay 56 is closed according to a signal from the transmission circuit 32 based on a turn of the ignition key, electric power leaks from a bus line 11 of the battery 10 to the vehicle body 80. An electric current is passed to the capacitor 34 and a resistance 35, and the capacitor 34 is charged until the terminal voltage is obtained. Meanwhile, the rectangular wave of the buffer 37 is transmitted via the resistance 35, the capacitor 34, the resistance 57, the vehicle body 80, and the buffer 37. At the completion of charging the capacitor 34, the rectangular wave is divided by the resistance 35 and the resistance 57.

Since the level of the rectangular wave input in the reversible input terminal 42 is lower than the reference voltage, a signal indicative of "high" is output from the comparator 41. When the signal indicative of "high" is input from the comparator 41, the transmission circuit 32 turns the transistor 48 ON, and the LED 51 is turned ON by the driving portion 49.

Figure 2:
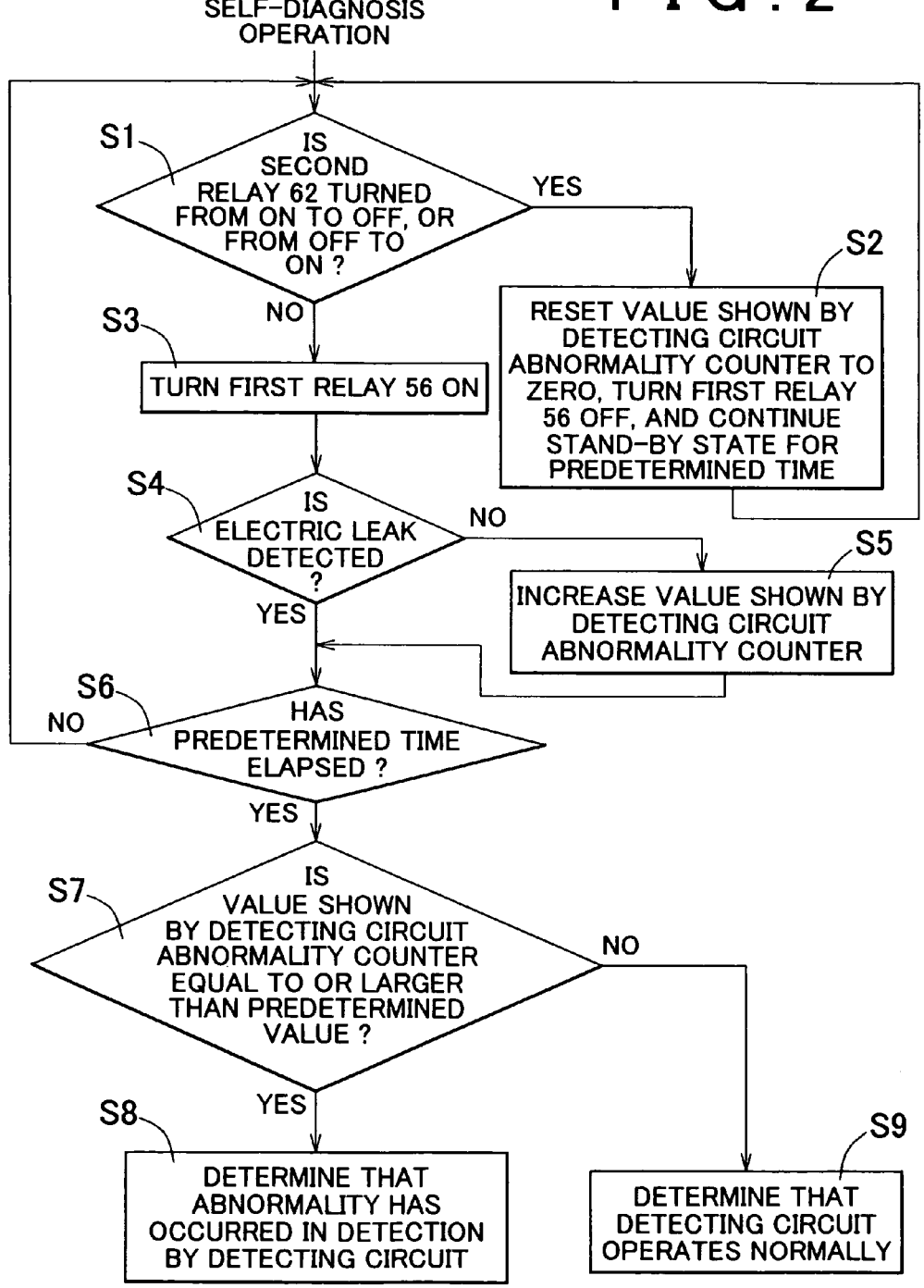
FIG. 2 is a flowchart showing an operation of the first embodiment.

The relationship between the normal operation and a simulated electric leak, and the diagnosis of the operation state of the electric leak detecting device 30 will be described with reference to FIG. 2. A self-diagnosis operation is started after a predetermined time (e.g. 10 seconds) has elapsed since an ignition is turned ON. In S1, the hybrid ECU 63 determines whether the second relay 62 is turned from ON to OFF, or from OFF to ON, that is, whether the ignition key is turned to the start position. When it is determined that the second relay is turned from ON to OFF, or from OFF to ON, according to an input from the hybrid ECU 63 to the battery ECU 31, a value shown by a detecting circuit abnormality counter in the transmission circuit 32 is reset to zero, a first relay 52 is turned OFF, and a stand-by state is continued for a predetermined time in S2.

When it is determined that the second relay 62 is not turned from ON to OFF, or from OFF to ON, the first relay 56 of the simulated electric leak generating device 55 is turned ON according to a signal from the transmission circuit 32 in S3, and an electric leak state is artificially generated. When an electric leak is not detected in S4, the value shown by the detecting circuit abnormality counter is increased. At this time, it is determined that the detection is abnormal. The value shown by the counter is increased for safety.

When an electric leak is detected in S4, it is determined whether a predetermined time has elapsed in S5. A stand-by state is continued for the predetermined time, in order to prevent an erroneous determination due to abruptly generated noise. When it is determined that the predetermined time has not elapsed, S1 is performed again. When it is determined that the predetermined time has elapsed, it is then determined whether the value shown by the detecting circuit abnormality counter is equal to or larger than a predetermined value in S7. The value shown by the counter is taken into consideration for safety. When it is determined the value is equal to or larger than the predetermined value, it is confirmed that detection by the electric leak detecting device 30 is abnormal in S8. When the value is smaller than the predetermined value, it is confirmed that detection by the electric leak detecting device 30 is performed normally in S9.

According to the embodiment, when the hybrid ECU 63 does not detect that the second relay 62 is turned from ON to OFF, or from OFF to ON (refer to S1), the first relay 56 is turned ON so as to generate a simulated electric leak. On the other hand, when the hybrid ECU 63 detects that the second relay is turned from ON to OFF, or from OFF to ON, the first relay 56 is temporarily turned OFF and the diagnosis is performed again after the predetermined time has elapsed, according to a command from the hybrid ECU 63 and the electric leak detecting device 30 (refer to S2). Accordingly, even when the voltage fluctuates in the common mode by turning ON/OFF the second relay 62, the diagnosis of the operating performance of the electric leak detecting device 30 can be performed accurately.

In addition, when a simulated electric leak generated by the simulated electric leak generating device 55 is detected by the electric leak detecting device 30, a stand-by state is continued until the value shown by the detecting circuit abnormality counter is increased (refer to S5) and further another stand-by state is continued for the predetermined time (refer to S6). Accordingly, the accuracy of the diagnosis is further enhanced.

Figure 3:
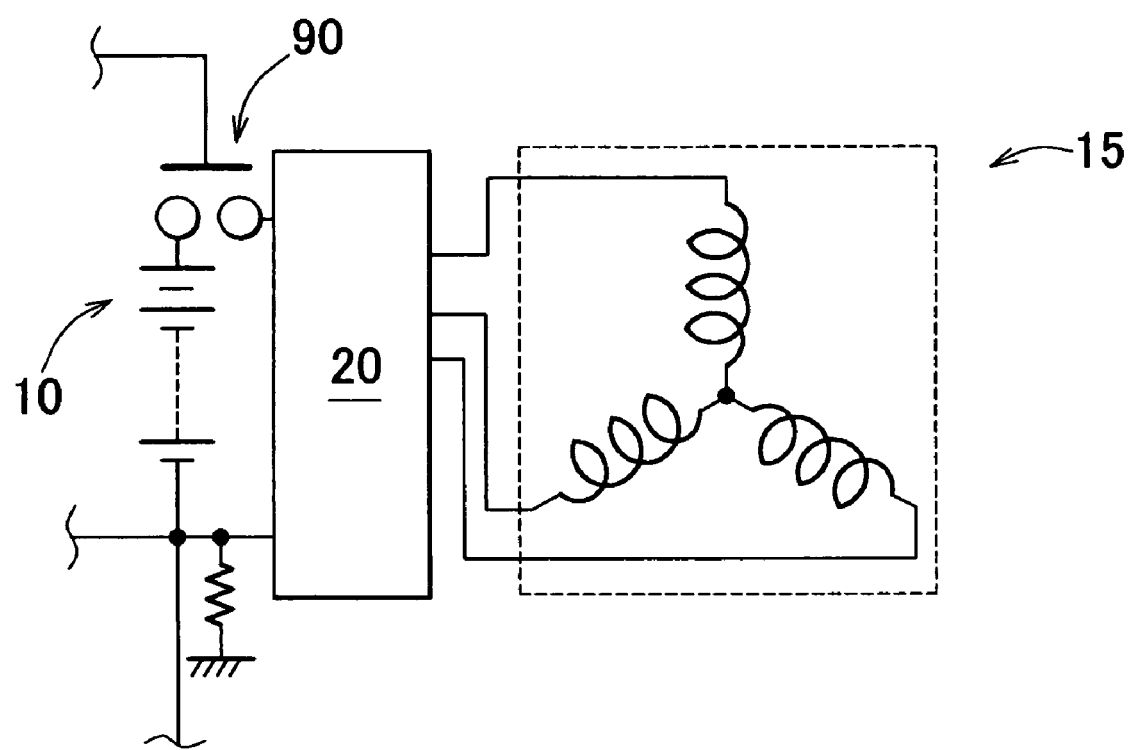
FIG. 3 is a schematic diagram of a main portion of a circuit, which shows a second embodiment of the invention.
Figure 4:
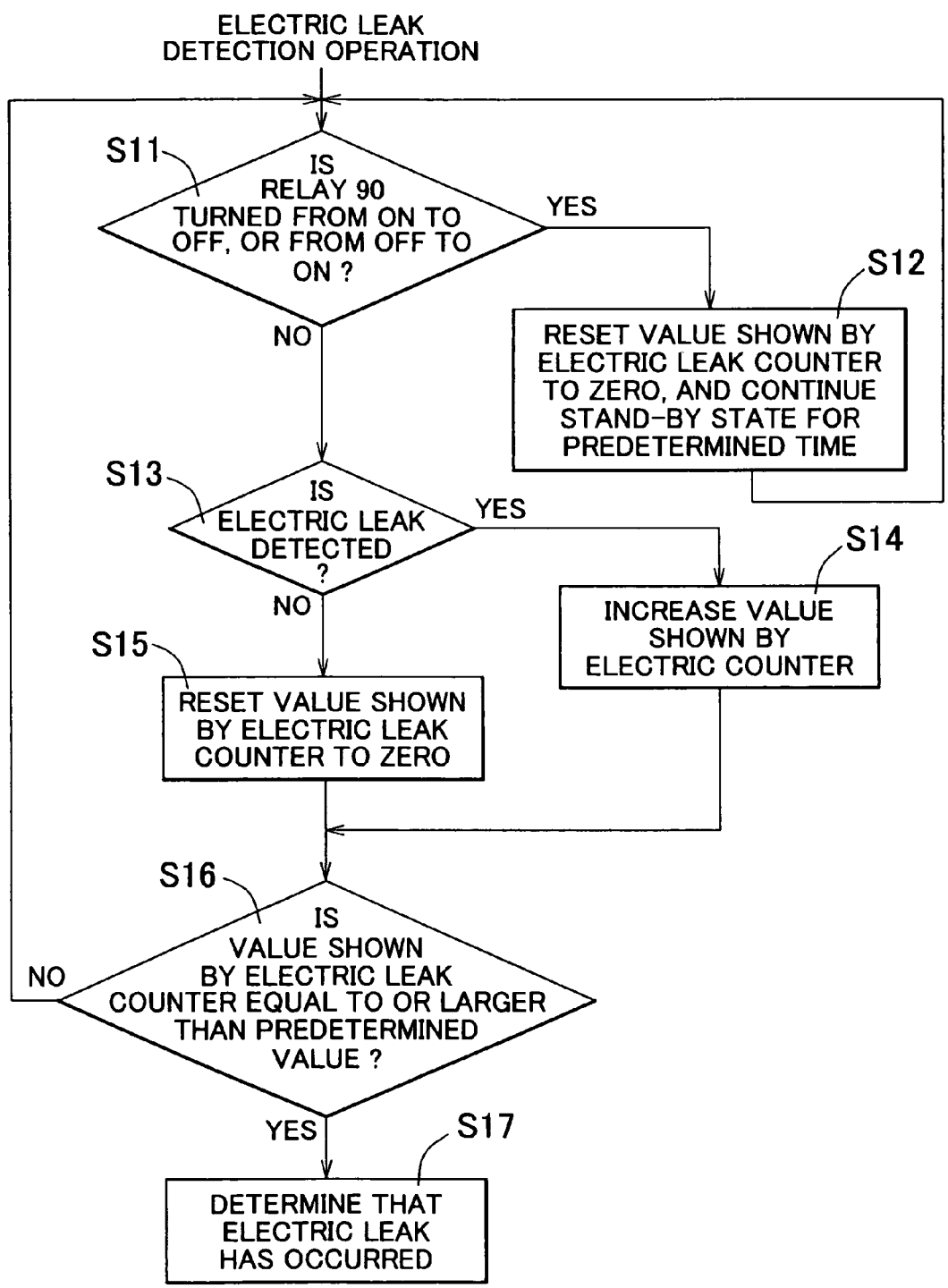
FIG. 4 is a flowchart showing an operation of the second embodiment.

A second embodiment is shown in FIG. 3 and FIG. 4. In the second embodiment, a diagnosis of the operation state of the electric leak detecting device 30 is performed.

As shown in FIG. 3, a power supply unit includes the battery 10, the motor 15 and the inverter 20. An electric leak detecting device (not shown) which detects an electric leak between the bus line 12 of the battery 10 and the inverter 20 has the same configuration as that of the electric leak detecting device 30 in the first embodiment, except for a counter. Namely, the electric leak detecting device according to the second embodiment includes an electric leak counter instead of the detecting circuit abnormality counter.

A diagnostic system (not shown) which performs a diagnosis of the operation state of the electric leak detecting device has a configuration similar to that of the diagnostic system in the first embodiment, and includes a relay 90 provided in the bus line 12 and the hybrid ECU 63. The diagnostic system does not include the simulated electric leak generating circuit 55 and a relay corresponding to the first relay 56.

An operation of the second embodiment will be described with reference to FIG. 4. In this description, the description of the electric leak detecting device 30 and the description of the simulated electric leak generating device 55 will be used where appropriate.

In S11, it is determined whether the relay 90 is turned from ON to OFF, or from OFF to ON. When it is determined that the relay 90 is turned from ON to OFF, or from OFF to ON, the value shown by the electric leak counter in the transmission circuit 32 is reset to zero, and a stand-by state is continued for a predetermined time. Then, S11 is performed again, and it is determined whether the relay 90 is turned from ON to OFF, or from OFF to ON, again. When it is determined that the relay 90 is not turned from ON to OFF, or from OFF to ON, S13 is then performed and the electric leak detecting device 30 detects whether an electric leak has occurred in the bus line 12. When an electric leak, that is, a ground fault, is not detected, the value shown by the electric leak counter in the transmission circuit 32 is reset to zero in S15. When an electric leak is detected in S13, the value shown by the electric leak counter is increased in S14. After the value shown by the electric leak counter is reset to zero in S15, or after the value shown by the electric leak counter is increased in S14, it is determined whether the value shown by the electric leak counter is equal to or larger than a predetermined value. When it is determined that the value is equal to or larger than the predetermined value, it is confirmed that an electric leak has occurred in S17. When the value is smaller than the predetermined value, S11 is performed again.

According to the embodiment, when the relay 90 is not turned ON/OFF, an electric leak is detected by the electric leak detecting device 30. However, when the relay 90 is turned ON/OFF, the value shown by the electric leak counter is reset to zero, a stand-by state is continued for a predetermined time, and an abnormality detection is performed again. Accordingly, even when the voltage fluctuates in the common mode by turning ON/OFF the relay 90, the diagnosis of the operating performance of the electric leak detecting device 30 can be performed accurately.

In addition, the stand-by state is continued until the value shown by the electric leak counter is increased in S14. Accordingly, the accuracy of the diagnosis is further enhanced.

As described so far, with the diagnostic system for the electric leak detecting device according to the first embodiment, even when the opening/closing means provided between the battery and the inverter is turned ON/OFF for any reason and therefore the common mode voltage fluctuates, the diagnosis of the operation state of the electric leak detecting device which detects a simulated electric leak can be performed accurately.

With the diagnostic system according to the first embodiment, even when the ignition key, which serves as the opening/closing means, is turned to the start position, or is turned from the start position to another position, the diagnosis of the operation state of the electric leak detecting device can be performed accurately. Also, with this diagnostic system, an exchange of a signal between the opening/closing detecting means and the simulated electric leak generating means is not required. Accordingly, the diagnostic system is simplified. In addition, with this diagnostic system, the diagnosis is performed at times other than the time when the opening/closing means is turned ON/OFF. Accordingly, the common mode voltage does not fluctuate while the diagnosis is performed. As a result, the diagnosis can be performed accurately.

Also, with the diagnostic system for the electric leak detecting device according to the second embodiment, even when the opening/closing means provided between the battery and the inverter is turned ON/OFF for any reason and therefore the common mode voltage fluctuates, the diagnosis of the operation state of the electric leak detecting device, which detects an electric leak, can be performed accurately.

Also, with this diagnostic system, even when the ignition key, which serves as the opening/closing means, is turned to the start position, or is turned from the start position to another position, the diagnosis of the operation state of the electric leak detecting device can be performed accurately. In addition, with this diagnostic system, the diagnosis is performed at times other than the time when the opening/closing means is turned ON/OFF. Therefore, the common mode voltage does not fluctuate while the diagnosis is performed. As a result, the diagnosis can be performed accurately.

What is claimed is:

1. A diagnostic system which performs a diagnosis of operating performance of an electric leak detecting device, in a power supply unit including a battery, a motor which is driven by the battery, an electric power converting device which is provided between the battery and the motor, a simulated electric leak generating device which generates an electric leak state between the battery and a vehicle body, and the electric leak detecting device which detects a simulated electric leak, comprising:

an opening/closing device which connects/disconnects the electric power converting device to/from the battery; and an opening/closing detecting device which detects opening/closing of the opening/closing device and which outputs a result of detection to the simulated electric leak generating device and the electric leak detecting device, wherein the electric leak detecting device performs at least one of retry and temporary suspension of both generation of a simulated electric leak and detection of an electric leak, when opening/closing of the opening/closing device is detected by the opening/closing detecting device.

2. The diagnostic system according to claim 1, wherein the opening/closing device connects the electric power converting device to the battery when an ignition key is at a start position, and disconnects the electric power converting device from the battery when the ignition key is at positions other than the start position.

3. The diagnostic system according to claim 2, wherein the opening/closing detecting device notifies the simulated electric leak generating device of opening/closing of the opening/closing device via the electric leak detecting device.

4. A diagnostic system which performs a diagnosis of operating performance of an electric leak detecting device, in a power supply unit including a battery, a motor which is driven by the battery, an electric power converting device which is provided between the battery and the motor, and the electric leak detecting device which detects an electric leak between the battery and a vehicle body, comprising:

an opening/closing device which connects/disconnects the electric power converting device to/from the battery, and an opening/closing detecting device which detects opening/closing of the opening/closing device and which outputs a result of detection to the electric leak detecting device, wherein the electric leak detecting device performs at least one of retry and temporary suspension of detection of an electric leak, when opening/closing of the opening/closing device is detected by the opening/closing detecting device.

5. The diagnostic system according to claim 4, wherein the opening/closing device connects the electric power converting device to the battery when an ignition key is at a start position, and disconnects the electric power converting device from the battery when the ignition key is at positions other than the start position.

6. A diagnostic method for performing a diagnosis of operating performance of an electric leak detecting device, comprising the steps of:

generating an electric leak state between a battery and a vehicle body; connecting/disconnecting an electric power converting device, which is provided between the battery and a motor, to/from the battery;

detecting connection/disconnection between the battery and the electric power converting device; and performing at least one of retry and temporary suspension of both generation of a simulated electric leak and detection of an electric leak, when connection/disconnection between the battery and the electric power converting device is detected.

7. A diagnostic method for performing a diagnosis of operating performance of an electric leak detecting device, comprising the steps of:

detecting an electric leak between a battery and a vehicle body; connecting/disconnecting an electric power converting device, which is provided between the battery and a motor, to/from the battery;

detecting connection/disconnection between the battery and the electric power converting device; and performing at least one of retry and temporary suspension of detection of an electric leak, when connection/disconnection between the battery and the electric power converting device is detected.

* * * * *